US008239797B1

(12) United States Patent
Ghosh et al.

(10) Patent No.: US 8,239,797 B1
(45) Date of Patent: Aug. 7, 2012

(54) CONGESTION AWARE BLOCK PLACEMENT

(75) Inventors: Sanjib Ghosh, Greater Noida (IN); Vandana Gupta, Delhi (IN); Hitesh Marwah, Noida (IN); Mahendra Singh Khalsa, Noida (IN); Pawan Fangaria, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 902 days.

(21) Appl. No.: 12/233,460

(22) Filed: Sep. 18, 2008

(51) Int. Cl.
*G06F 17/50* (2006.01)
(52) U.S. Cl. ........ 716/110; 716/111; 716/119; 716/122; 716/123; 716/126
(58) Field of Classification Search .......... 716/110–111, 716/118–126
See application file for complete search history.

(56) References Cited

U.S. PATENT DOCUMENTS

| 8,010,928 | B1 * | 8/2011 | Birch et al. ............ 716/126 |
| 2004/0221253 | A1 * | 11/2004 | Imper et al. ............ 716/13 |
| 2004/0230933 | A1 * | 11/2004 | Weaver et al. ............ 716/12 |
| 2006/0294485 | A1 * | 12/2006 | Kaul et al. ............ 716/10 |

* cited by examiner

*Primary Examiner* — Paul Dinh
(74) *Attorney, Agent, or Firm* — Schwegman, Lundberg & Woessner, P.A.

(57) ABSTRACT

A circuit design process is presented that includes a block placement operation, followed by global routing based upon the initial placement of the blocks. Congestion data is generated from the global routing and, in an automated process, the blocks are placed again based upon the congestion data to reduce the routing congestion of the design. This can be used as part of a custom layout design process, for example.

26 Claims, 16 Drawing Sheets

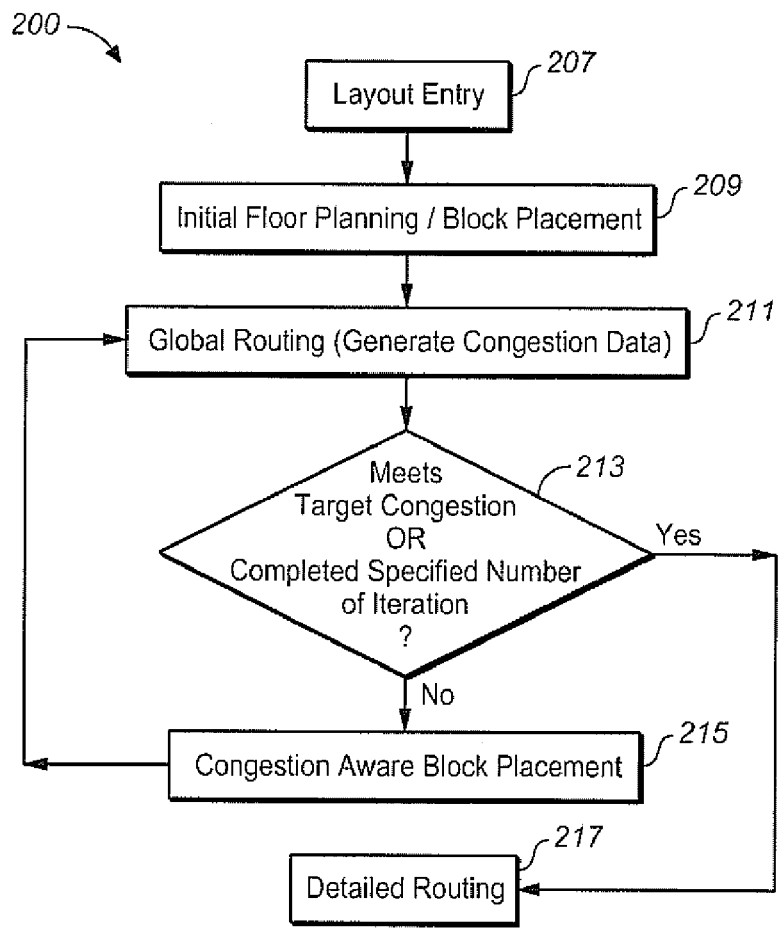
FIG. 2
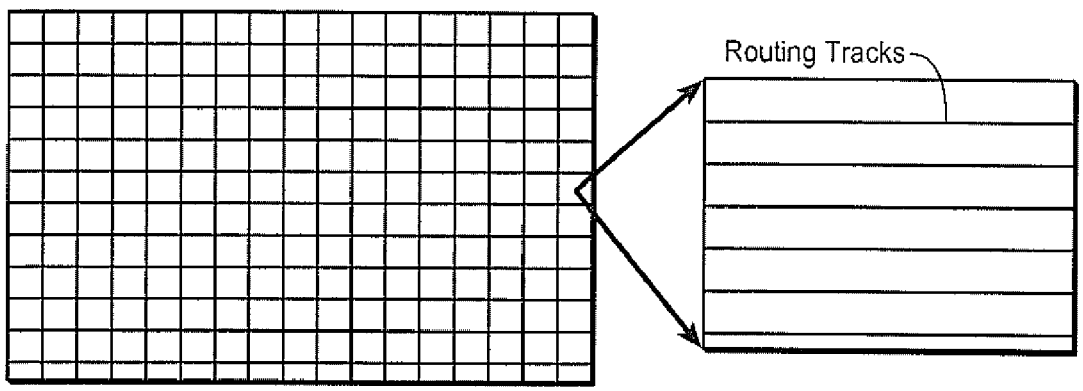
FIG. 3A     FIG. 3B

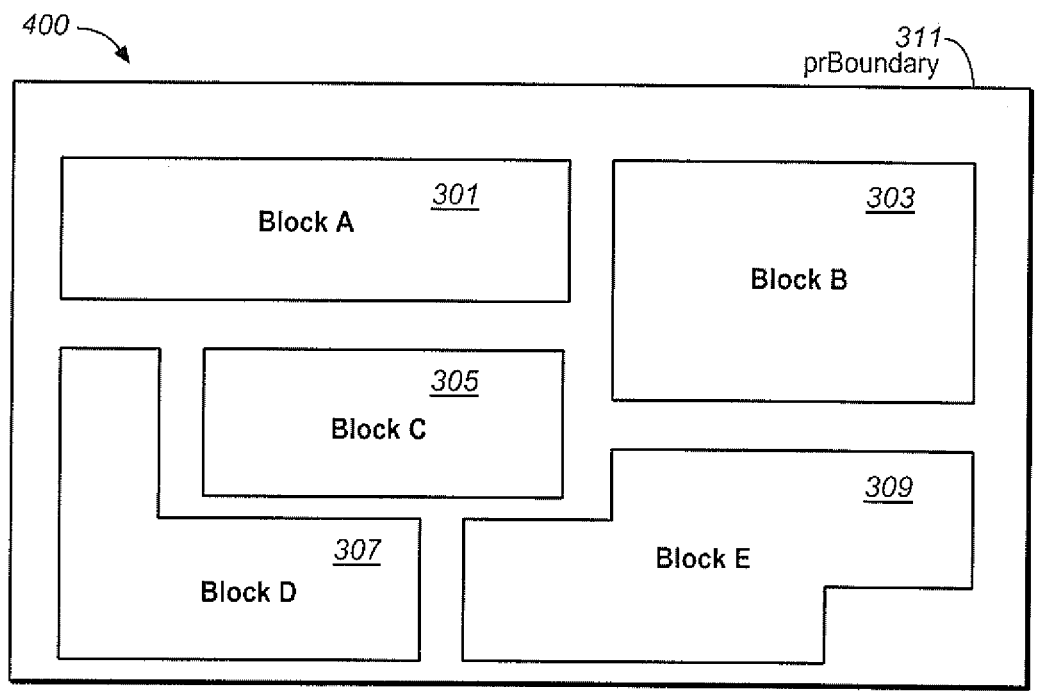
FIG. 4
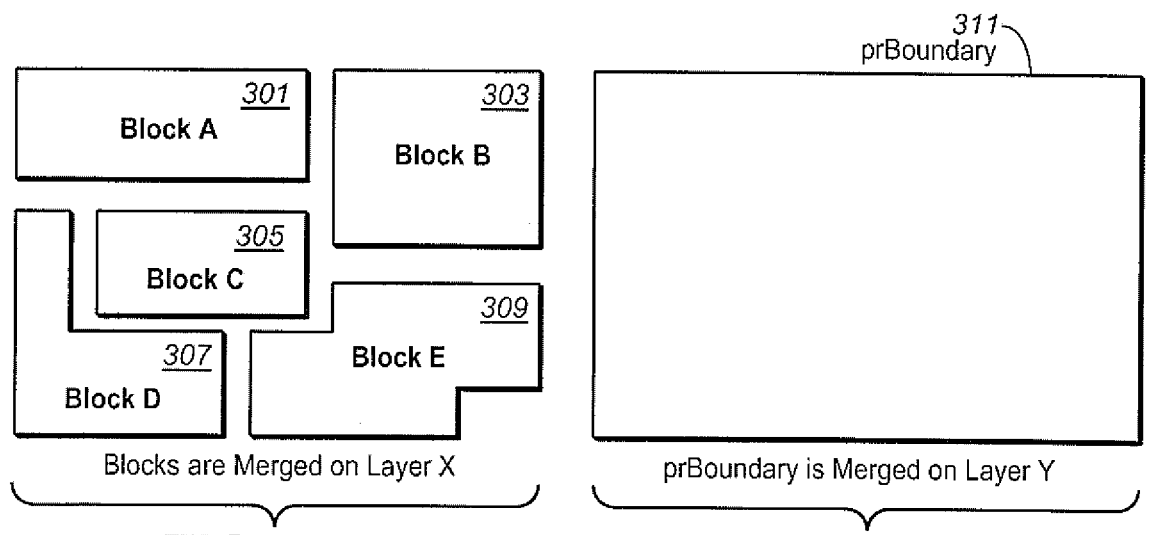
FIG. 5A  FIG. 5B

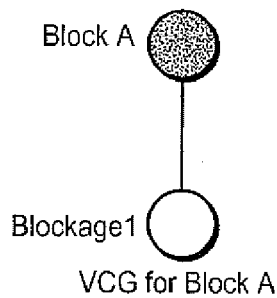
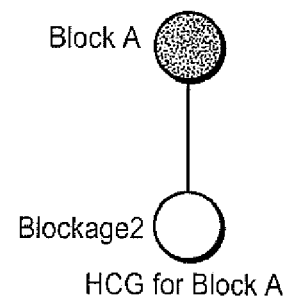
VCG for Block A
HCG for Block A
*FIG. 15A*
*FIG. 15B*
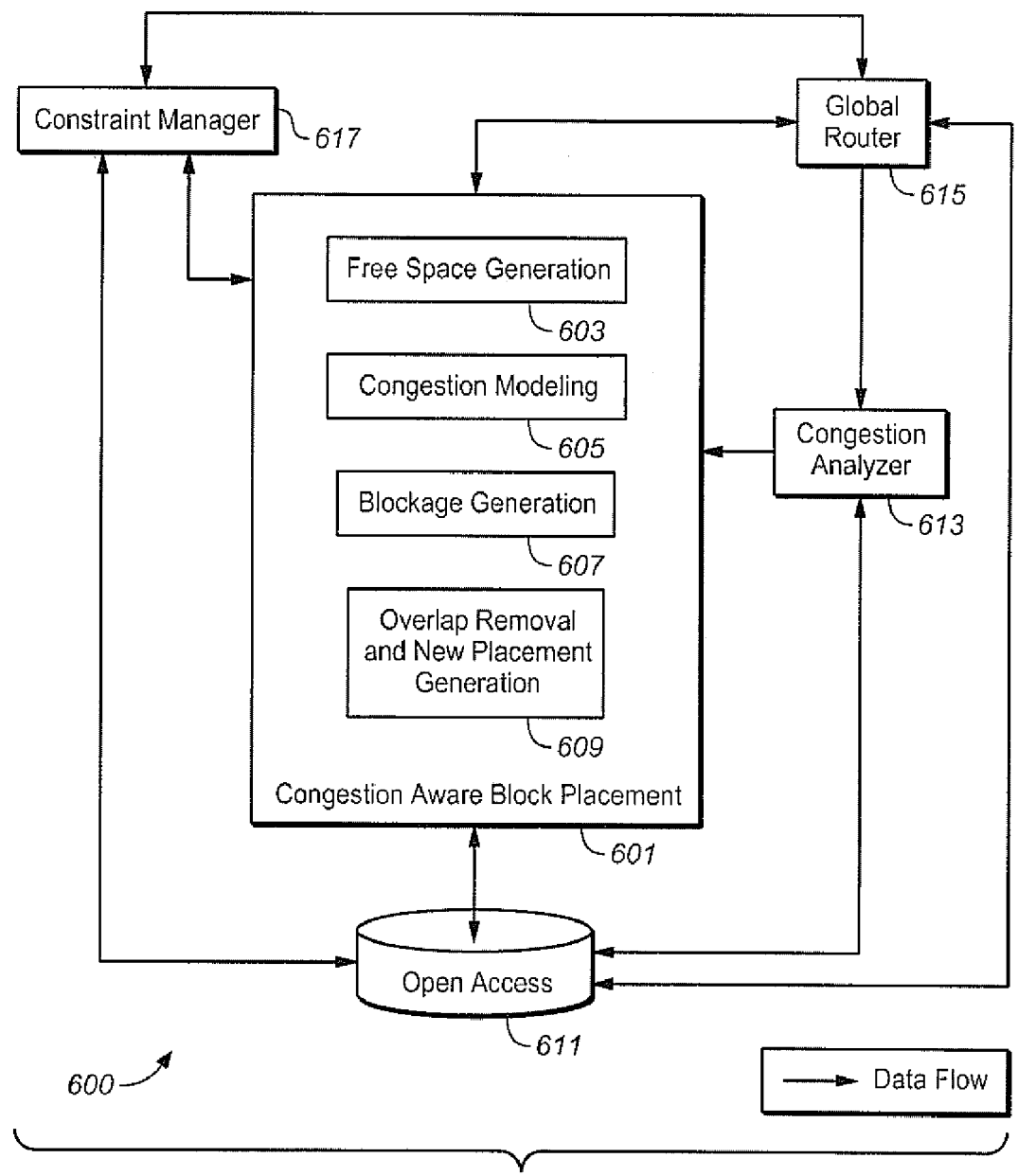
*FIG. 16*

CONGESTION AWARE BLOCK PLACEMENT

BACKGROUND OF THE INVENTION

1. Field of Invention

This invention relates to automated integrated circuit design data and, more specifically, to routing congestion removal during block placement, particularly for custom design.

2. Description of Related Art

A typical custom/analog design flow 100 is shown in FIG. 1 and starts with design entry 101; generally it is done through schematic entry or HDL representation. The design entry is done carefully to meet the design specification and is verified by simulation 103. When a design meets the required specification ("Yes", 105) then its physical implementation starts which is known a physical design.

Physical design can be broadly categorized into following stages:

1. Layout Entry 107
2. Floorplanning 109
3. Routing

Layout Entry 107 is the first step of physical design which is a physical representation of a design. At the floorplanning stage 109, the design is partitioned into various blocks depending upon the net connectivity between the layout components. The blocks are optimally placed in the entire design space such that wire length and chip area are minimum. After the floor planning, the next step is routing which can be divided into two parts.

1. Global routing 111
2. Detailed routing 117

Global routing determines the routing paths and routability of the design, whereas the detailed routing does the actual routing of wires. After the detailed routing, the flow continues at 119.

Routability of a design is determined by the routing congestion of the design, and decreases with the increase of routing congestion. So it is essential to reduce routing congestion in a design before going to detailed routing. Generally routing congestion of a design is determined by the global routing at stage 111, but it can be improved at the floor planning block placement stage 109. So if a design is found to be over congested 113 at the global routing stage 111, then the design needs to be placed again. This process continues until the design comes to a satisfactory congestion level. Manual iteration 115 is possible for a small design to reach a required congestion level, but for a big and/or complex mixed-signal design it is cumbersome or near impossible to do so.

Unlike the digital domain, spaces in custom domain are very irregular. This increases the complexity in a custom block placer as it needs to search and optimize the entire design space. In custom design flow it is fairly uncommon to optimize congestion at the placement stage because of this complexity; but with the increasing size and complexity in analog/mixed-signal design, it has become essential to optimize routing congestion for custom block placers.

SUMMARY OF INVENTION

A circuit design process is presented that includes a block placement operation, followed by global routing based upon the initial placement of the blocks. Congestion data is generated from the global routing and, in an automated process, the blocks are placed again based upon the congestion data to reduce the routing congestion of the design.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DRAWINGS

FIG. 2 shows an embodiment for a congestion aware block placement flow.

FIG. 3 illustrates the concept of a congestion map.

FIGS. 4-6 show a design and its generated free space.

FIG. 15 shows constraint graphs for the sample block.

FIG. 16 shows an exemplary code architecture diagram.

DETAILED DESCRIPTION

Overview

Figure 1:
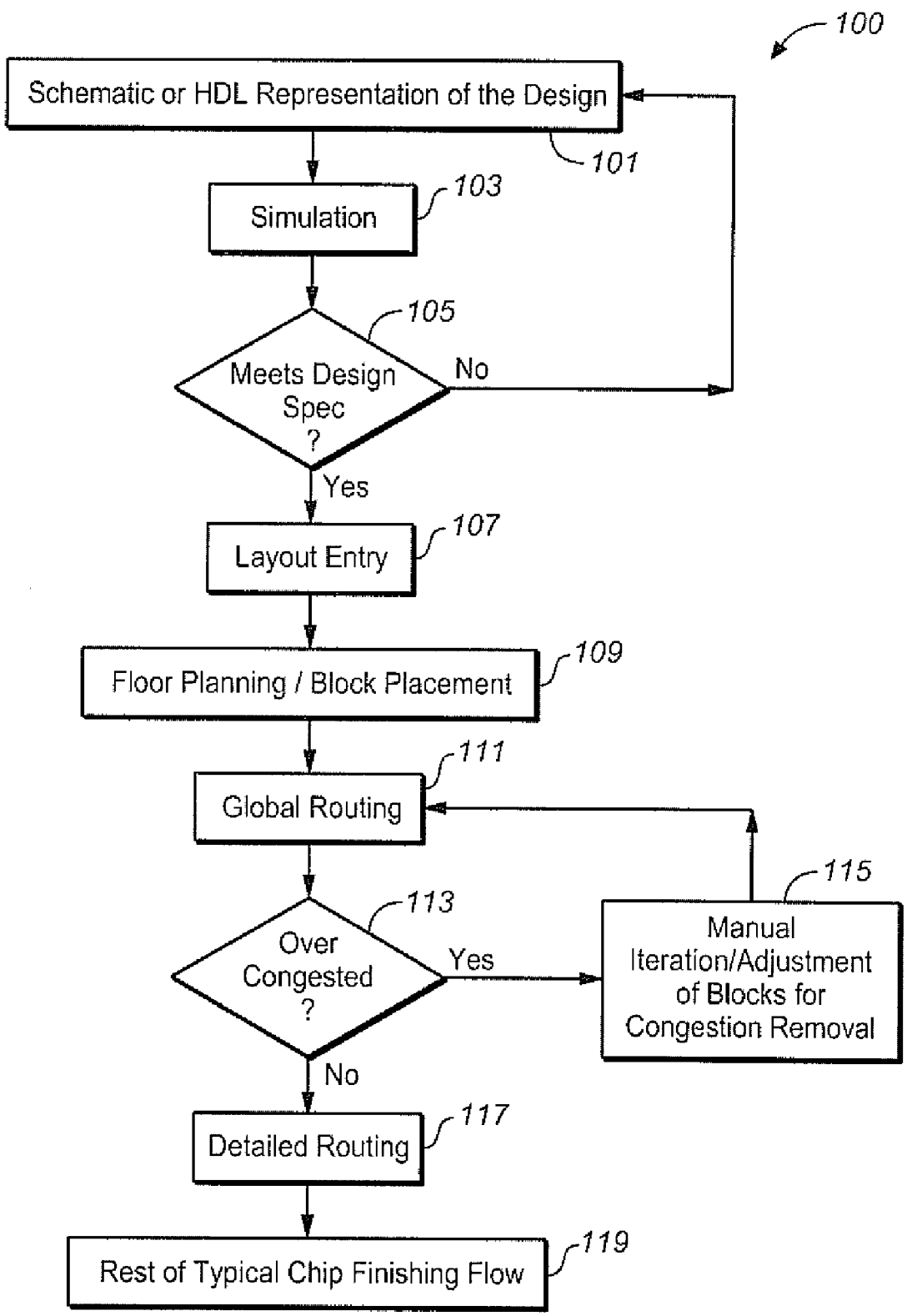
FIG. 1 shows a typical custom design flow.

With the increase of design size and the complexity of the lower process nodes, routing congestion plays an important role in the analog/mixed-signal design space. The following introduces a new congestion aware block placement technology in the custom block placer to handle routing congestion in conjunction with the routing process. With this technology, routing congestion can be identified and removed much earlier in the overall design cycle, helping the designers to get a placement with improved routability. The algorithm of the exemplary embodiments work in an incremental mode, i.e., it does not disrupt, but rather maintains, the overall placement topology and also keeps the design constraints intact. It moves the blocks from higher congestion to lower congestion areas. This capability allows users to analyze routing congestion of a design and get an effective placement solution with improved routability and reduced congestion.

As was noted in the Background, spaces in the custom domain are very irregular relative to the digital domain, increasing the complexity in a custom block placer as it needs to search and optimize the entire design space. Consequently, automation can be important to tackle or remove congestion at the placement stage itself. Embodiments of the present invention introduce a new space based algorithm to reduce the routing congestion at the placement stage. This is a new approach to reduce routing congestion at block placement stage. It works in conjunction with the router, which is used as a global router to compute congestion. A new block placement solution is generated using new algorithms to reduce routing congestion. Then the global router is run to verify if the congestion is within desired limit.

FIG. 2 shows an exemplary embodiment. In this process 200, following the layout entry 207, an initial floor planning and block placement is performed at 209. Global routing 211 is then performed, including the generation of congestion data for this block placement.

Routing congestion of a design is determined by the global router at the routing stage 211. Congestion of a region is the ratio of demand of routing tracks to the supply of the routing tracks in that particular region. Demand of routing tracks is the required routing tracks to route all the pins and supply of the routing tracks is the available routing tracks in that region. To compute the congestion of a design, the router divides the complete design space into small cells. These cells are known as GCells. The congestion aware block placer is aware of the congestion data and reads the congestion information of each GCell as input and generates a new placement with reduced routing congestion.

FIG. 3A shows a design space which is divided into small cells, known as GCells. Each individual GCell (FIG. 3B) consists of routing tracks. The number of routing tracks per GCell is typically a default value set by the global router, but user input can be given to re-size a GCell size for improved granularity. The global router computes congestion of a GCell and then tags the congestion value to that GCell. The available number of routing tracks is known as supply for that GCell, and the required number of routing tracks to complete the routing over the GCell is known as demand. Congestion of a GCell is the ratio of demand and supply, i.e. ratio of required routing tracks and available routing tracks:

Congestion=Demand/Supply=required_routingtracks/available_routingtracks

Referring back to FIG. 2, at stage 213, it is determined whether a target value for congestion is met and, if so, the process goes on to detailed routing at stage 217. If the target is not met, a congestion aware block placement operation is performed at 215, before returning back to global routing 211 so the congestion can be determined and checked. Also, a limit on the number of iterations can be set up at 213. In this embodiment the complete design is processed, and free spaces are identified and modeled to compute congestion between the blocks. Eventually this computed congestion value determines direction of the movement of every block.

Further, the exemplary embodiment can include a number of features as shown in FIG. 2. This includes routing congestion as measured by the global router at 211. Further, congestion aware block placement 215 uses congestion data generated by global router. Also, in this algorithm, the "block placement" 215 is revised depending upon the available congestion data after global routing at 211, being done in such a way so that the congestion level in the design is reduced. The automatic process of 211-215 continues until either congestion level comes down to the specified level or a specified number of iterations of the loop are performed. Both the congestion level and maximum number of iterations can be user specified, although default values are possible. Detailed routing 217 then follows.

Generation of Free Space

Figure 6:
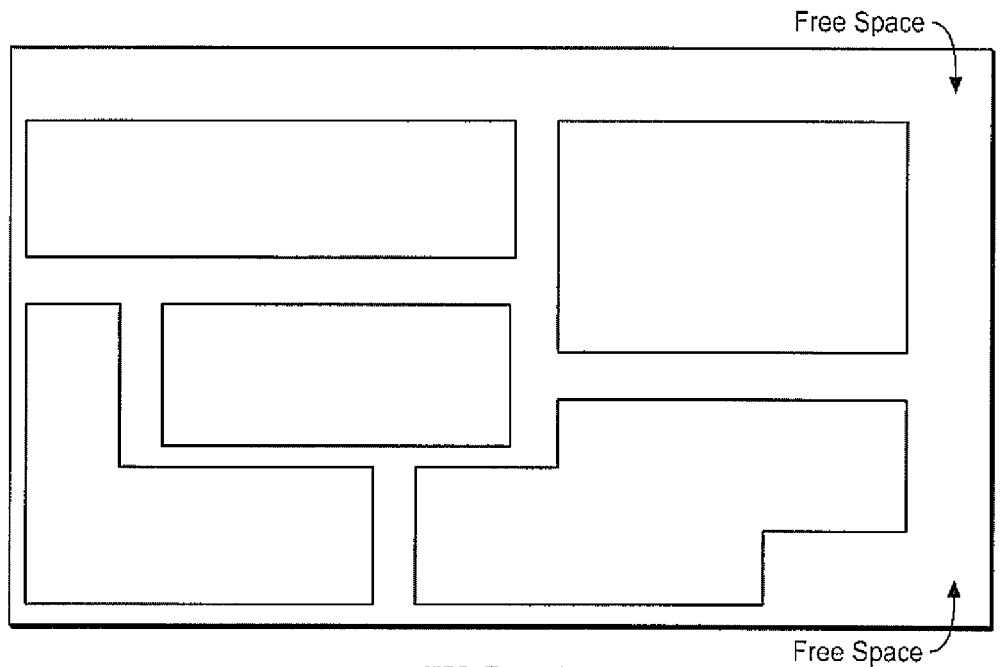

FIGS. 4-6 illustrate an example of the free space of the design generated using layer Boolean operations. FIG. 4 represents a design 400 with five blocks (Blocks A-E, 301-309) and place and route boundary (represented by prBoundary 311). In FIG. 5(A), every block from FIG. 4 is considered as a shape, and all the shapes are merged on a layer, say X. In FIG. 5(B), the prBoundary 311 from FIG. 4 is merged on layer Y.

FIG. 6 illustrates an example the free space (the shaded space which is not covered by the blocks) which is the result of the Boolean operation of the layers X and Y from FIGS. 5(A) and 5(B). The layer Boolean operation has been done by subtracting (using and Not operation) layer X (space covered by the blocks) from the layer Y (the entire design space). After obtaining the free space in the design, it is fractured optimally (as shown in FIG. 7) to identify the spaces between the blocks accurately, which helps in computing the overall congestion between the blocks.

Figure 7:
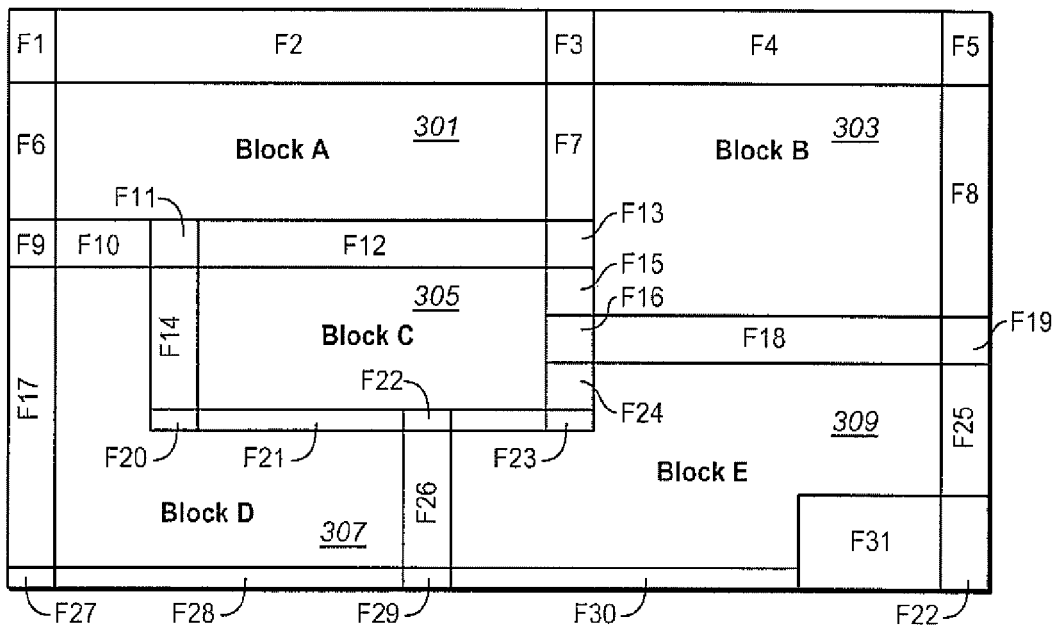
FIG. 7 shows a representation of the fractured spaces from the design shown in FIGS. 4-6.

FIG. 7 shows a representation of the fractured spaces from the design shown in FIGS. 4-6. The fractured spaces are F1-F31. In one embodiment the free space is fractured in such a way that the spaces between the blocks can be computed accurately; for example, the free space between blocks "A" 301 and "B" 303 is F7. Similarly the free spaces between the block "C" 305 and "D" 307 are F14, F20 and F21.

Fracturing and free space, along with GCells and many of the other concepts used here are also developed in a US patent application entitled "Congestion Aware Pin Optimizer" by Mahendra Singh Khalsa, Sanjib Ghosh, Vandana Gupta, Hitesh Marwah and Pawan Fangaria, filed on the same day as the present application, which considers automated techniques for other elements of the design flow and which is complementary to the aspects presented here.

Computation of Congestion

Congestion is computed over the entire free space. This is done by computing congestion value of each GCell of every fractured space. (GCells over the blocks do not contribute to the computation of congestion between the blocks.) The congestion information is obtained from each GCell and stored by the global router. In this process only the GCells having congestion values greater than a target value for congestion are taken into account. GCells with congestion value below target congestion level are considered to be at a satisfactory congestion level for the design and are ignored. The target value can be a set, predetermined value, can be specified by the user, or possibly a value that dynamically adapts to the process.

Here, congestion weight ($\Delta$Con) of a GCell is defined as:

$\Delta$Con=(current congestion value)−(target congestion value), where $\Delta$Con=0 if (current congestion value)<(target congestion value) of the GCell. Congestion weight (ConWeight) of a fractured space is computed as the sum of $\Delta$Con for all the GCells in that fractured space.

$$ConWeight = \sum_{1}^{n} \Delta Con,$$

Where n=number of the GCells in a fractured free space. If a GCell overlaps with two fractured free spaces then for computing Con Weight, that GCell is taken into account for both fractured spaces.

The value of ConWeight of a fractured free space determines the direction of movement of the blocks adjacent to it. This is explained in detail in the following sections.

Modeling Blocks and Assigning Weights

Figure 8:
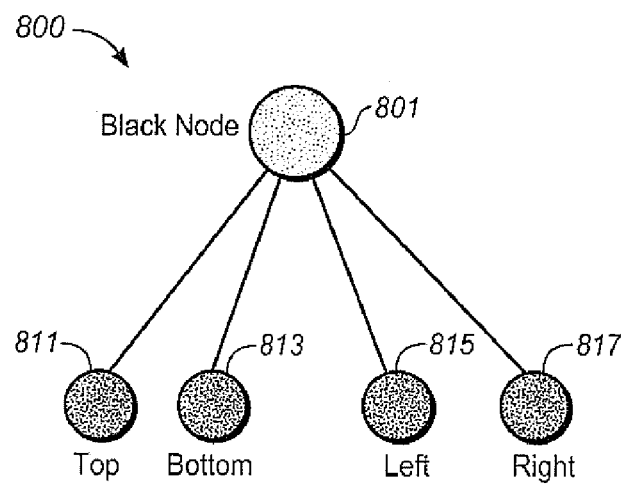
FIG. 8 shows a model of a block and degrees of freedom of movement.

Having computed the congestion of the fractured space, this section models every block as a node where every node has four children. Each child represents the degree of freedom of the block, i.e., there can be four possible moves of a block. As shown in FIG. 8, the possible moves for the block node 801 are top 811, bottom 813, left 815 and right 817. At a time one block can move only in two directions, one direction being either left or right and the other direction being either to the top or the bottom.

For all the edges of the block, the adjacent fractured free spaces are identified. The congestion weight for an edge of a block is computed as the sum of Con Weight of all the fractured free spaces adjacent to it. Congestion weight is computed for all the edges of a block and is assigned to the children of the block. This is explained with an example below.

Figure 9:
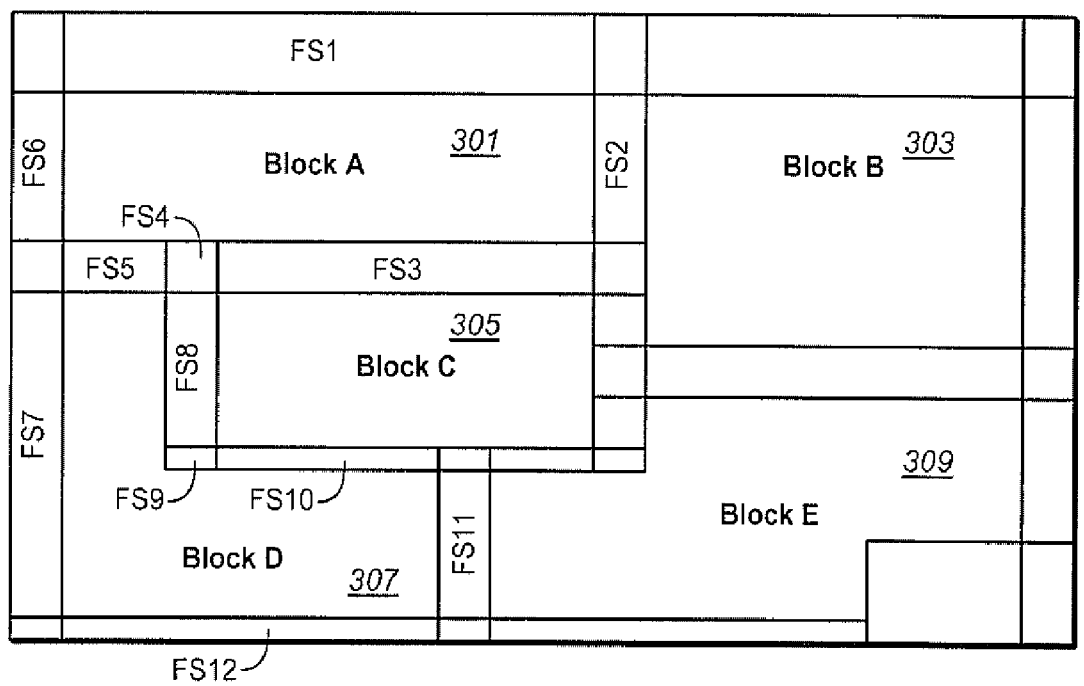
FIG. 9 shows the generated free space from FIG. 7.

FIG. 9 consider the fractured free spaces around the block A 301 FIGS. 4-6 and 8, where only the fractured free spaces of block A 301 and block D 307 are explicitly labeled. The fractured free spaces which are effectively contributing to compute the congestion weight of the edges of block "A" are marked with number FS1, FS2, FS3, FS4, FS5, and FS6. Fractured space FS1 is adjacent to the top edge of block A. So the weight of the top child of node (811, FIG. 8) of block A is Con Weight of fractured space FS1. Similarly fractured spaces FS6 and FS2 contribute to the congestion weight of left and right child respectively. There are three fractured spaces adjacent to the bottom edge of the block A. These three fractured spaces are FS3, FS4, and FS5. So the congestion weight for the bottom child is sum of Con Weight of FS3, FS4, and FS5. The weighted graph for block A is given in FIG. 10.

Figure 11:
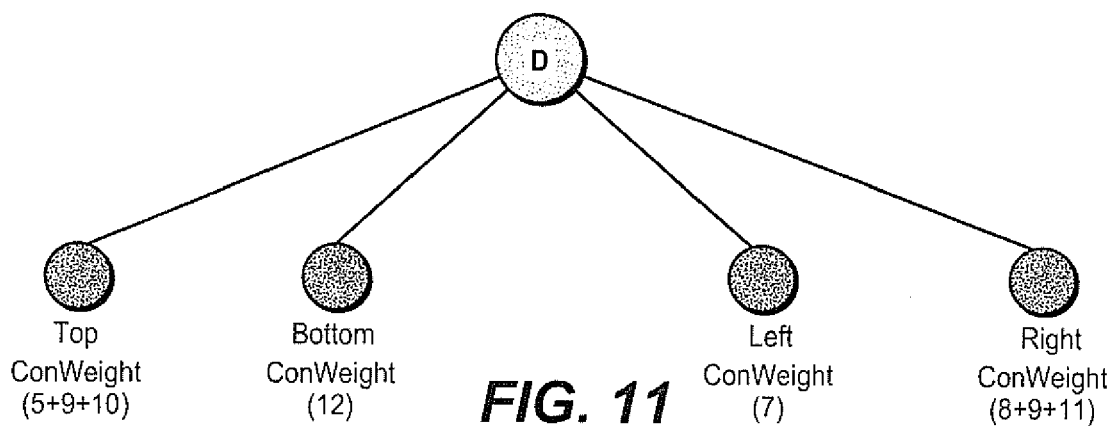

For rectilinear blocks, the computation of weight of a node is treated a little differently from the rectangular blocks. In this case the weight of a child is computed as the sum of weights associated with all the edges of the block in that direction of movement. For example, consider the block D 307: the weight for the top child is the sum of the weights of two edges in top direction. There are three fractured spaces associated with these two edges (FS5, FS9 and FS10). Similarly, the weight of the right child is the sum of three fractured spaces FS8, FS9 and FS11. The weighted graph for the block D is shown in FIG. 11. Here note that the fractured space FS9 is considered for both the right and the top child.

Modeling Congestion into Blockage

During block placement of the automatic process of 211-215 in FIG. 2, blocks are not placed over the placement blockages. This feature has been leveraged to move blocks away from the high congestion area. In this section congestion around the blocks is modeled as placement blockages. The blockages are created over the relevant (described below) fractured free spaces and extended to create an overlap with the blocks depending upon the over congestion in that free space. When block placement is done, the overlap between the blocks and placement blockages is removed by moving the blocks in the direction away from the blockages. This results in the block movement away from the high congestion area, as described in the detailed elements of the following paragraphs.

The weighted graph created in the previous section is used to decide the direction in which a block needs to be moved. The block can be moved in horizontal (left or right) and vertical (top or bottom) direction. If the weight of the top child is more than the weight of the bottom child of a node, placement blockages are created over the fractured free spaces associated with the top child and extended over the top edge(s) of the block; otherwise, the placement blockages are created over the fractured free spaces associated with the bottom child and extended over the bottom edge(s) of the block. This controls the vertical movement of the block. Similarly, the blockages are created in left or right edge(s) of the blocks to control the horizontal movement of the block. If there is no weight in the vertical direction (i.e., the weight is zero for top and bottom child of a node), no placement blockage is created for that block in vertical direction and hence no vertical movement occurs. Similarly, if there is no weight in the horizontal direction, no placement blockage is created for that block in horizontal direction and no horizontal movement occurs.

The blockage overlap area is computed depending upon the difference of weight between the two opposite children in the weighted graph. In one embodiment, to get the optimum result, the maximum possible overlap is restricted by the width of a GCell. An example of the process of removing overlap is shown in FIGS. 12-15 and is done by forming vertical constraint graph (VCG) and horizontal constraint graph (HCG) of FIG. 15 that are described in next section. The blockages are deleted after removal of the overlap. An example of pseudo code to implement the process of 211-215 of FIG. 2, as illustrated for a block in FIGS. 12-15, is as follows:

```
Input: Target congestion value
Output: Design with reduced congestion
Begin.
   FreeArea←Compute the free area in the design
   FreeSpaceArray←-Fracture(FreeArea)
   Blocks←get the blocks in the design
   for each block b in Blocks
      blockFreeSpaceArray←Identify fractured free areas
         in FreeSpaceArray touching edges of block b
      weightArray←Compute the weight for edges of
         block b using blockFreeSpaceArray
      if (weigthArray[bottom]>weightArray[top])
         DELTA←Compute delta using weightArray[bot-
            tom]
         blockedArea←Extend free areas in block-
            FreeSpaceArray[bottom] by DELTA
      else
         DELTA←Compute delta using weigthArray[top]
         blockedArea←Extend free areas in block-
            FreeSpaceArray[top] by DELTA
      if (weigthArray[left]>weightArray[right])
         DELTA←Compute delta using weigthArray[left]
         blockedArea←Extend free areas in block-
            FreeSpaceArray[left] by DELTA
      else
         DELTA←Compute delta using weigthArray[right]
         blockedArea←Extend free areas in block-
            FreeSpaceArray[right] by DELTA
      blkg←Create placement blockage in blockedArea
      Add blkg to blkgArray
   end
   RemoveBlockageOverlap0
   for each blockage blkg in blkgArray
      remove blockage blkg
   end
```

Figure 10:
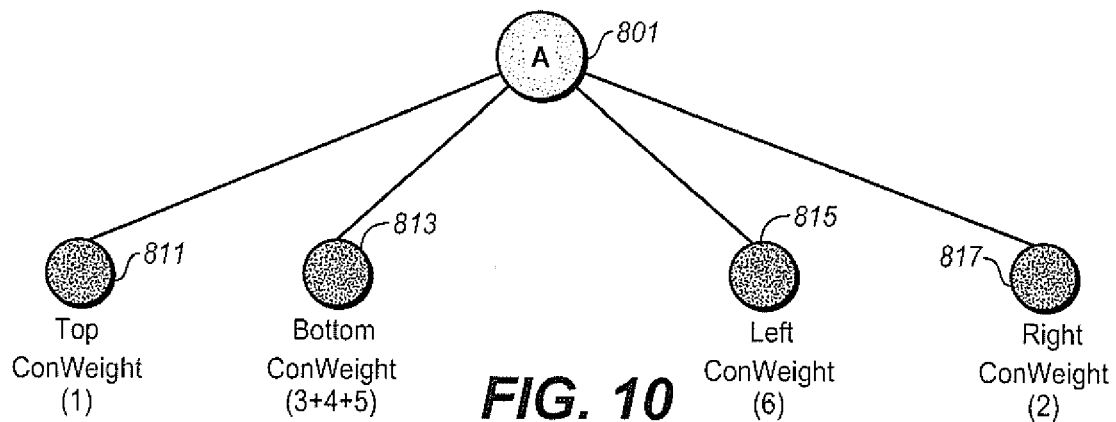
FIGS. 10 and 11 show a weighted graph for a sample block.
Figure 12:
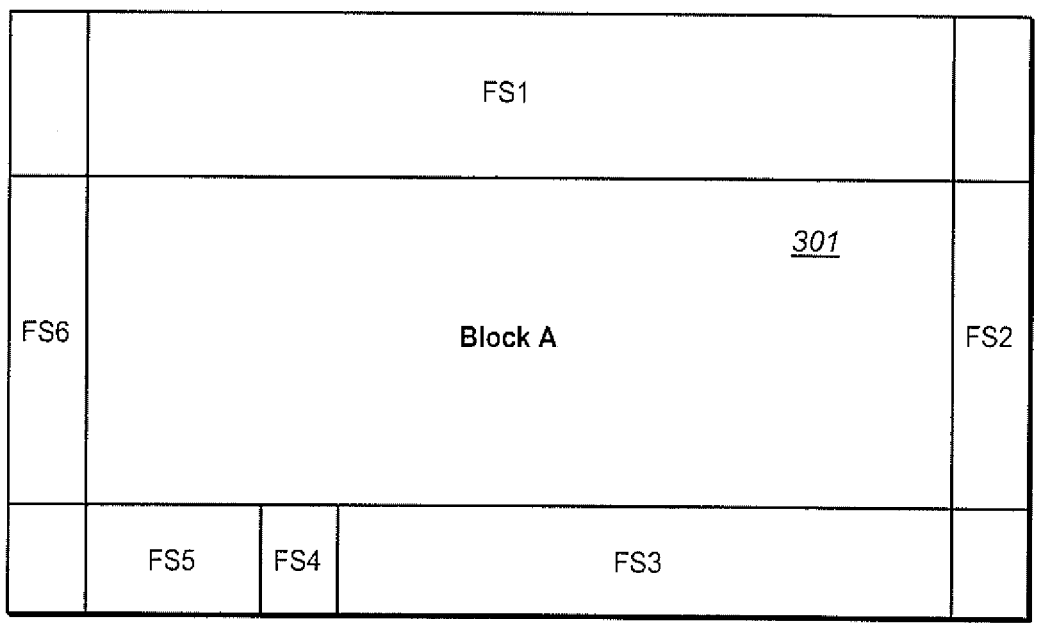
FIGS. 12-14 illustrate placement of the sample block.
Figure 13:
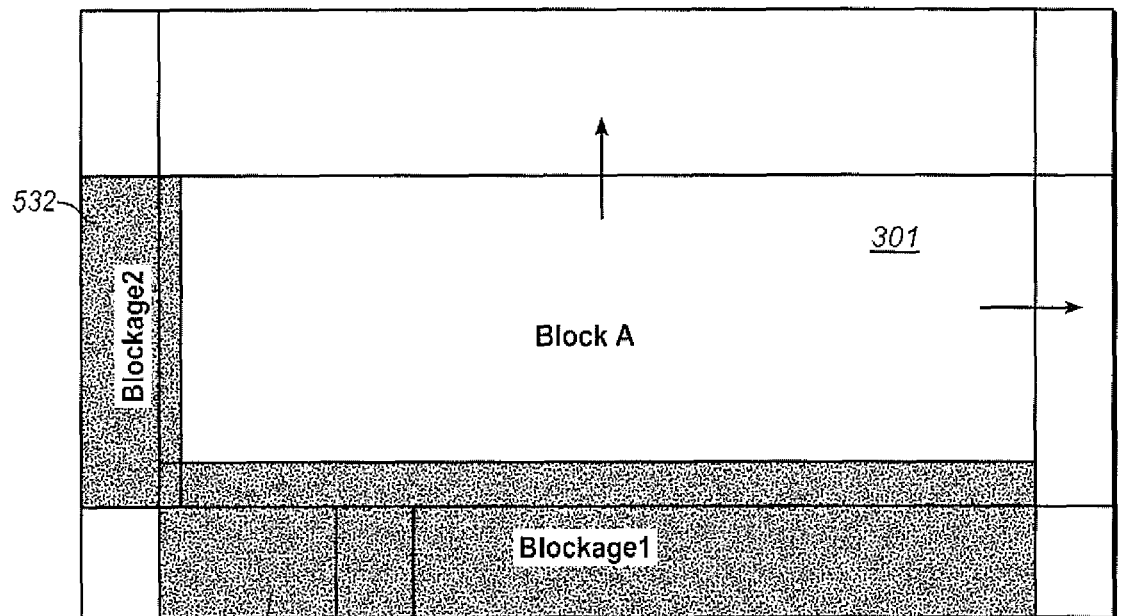

The process of creation of blockages and a corresponding new block placement is illustrated for block A 301 of FIGS. 4-7 and 9. FIG. 12 shows the detail for block A 301 and its adjacent fractured spaces. FIG. 13 shows the creation of blockages for block A 301, where the corresponding weighted graph for the block A was shown in FIG. 10. Now assume that, as shown in FIG. 10, the weight of the bottom child is W1=ConWeight(3+4+5) and of the top child is W2=ConWeight(1). Similarly, that the weight of left child is W3=ConWeight(6) and of the right child is W4=ConWeight (2). Further assume that W1>W2 and W3>W4. Consequently, placement blockages need to be created at the bottom edge and left edge.

Figure 14:
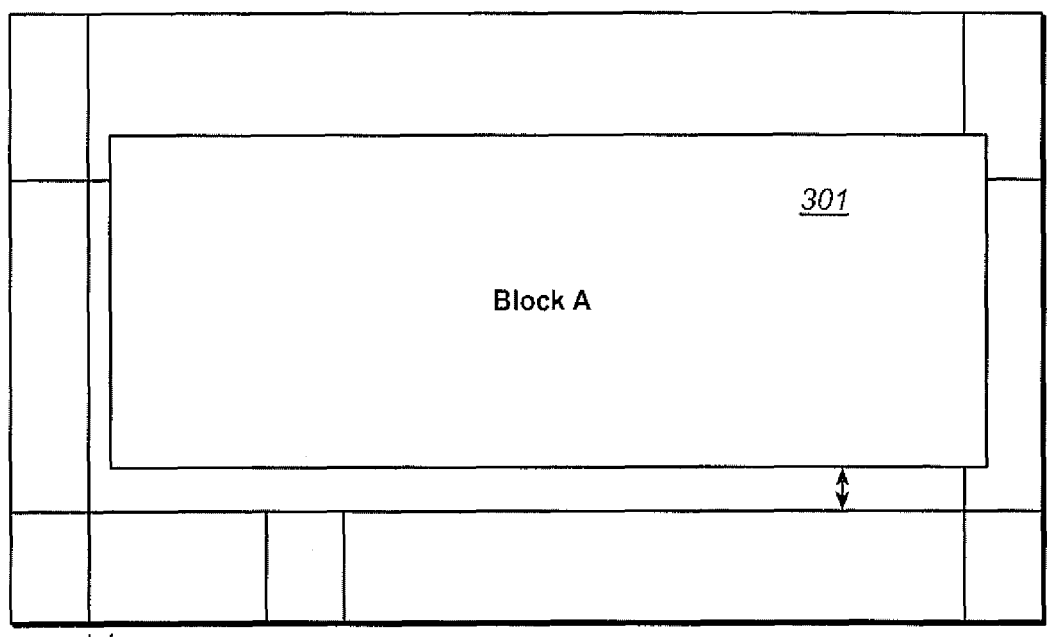

In the FIG. 13 two blockages 531 and 532 have been added at the bottom and at the left side and two arrows indicate the intended movement of block A 301. The blockages are created to overlap with the block. After the new block placement, the position of block A 301 is shown as in the FIG. 14. FIG. 14 represents the position the Block A after removing the overlap with blockages. This figure represents that new free space is created at the bottom and left edge. This new free space eventually helps to reduce the congestion in that region.

Vertical and Horizontal Constraint Graphs

Constraint graphs are used to represent overlap between blocks. The vertical constraint graph (VCG) represents the vertical overlap between the blocks. In this graph every node represents a block and every edge represents the overlap between two nodes. Here every blockage is also considered as a node. While the graph is formed for the entire design, this graph represents the vertical dependency. The goal is to remove the vertical overlap by shifting the blocks upwards or downwards. With removal of every overlap, the edge between the nodes is also removed. The node which does not have any edge is removed from the graph. This continues until there is no node in the graph, i.e. there is no vertical overlap in the design. The Horizontal Constraint Graph (HCG) is similar to the VCG. The only difference is that it represents the horizontal overlap between the blocks. FIG. 15 shows VCG and HCG for block A.

Iteration of Global Router

The algorithm considers the high congestion areas and reduces congestion by moving the blocks away and creating more spaces in that area; but there is a chance that other areas may get congested in this process. So the routing congestion in the design is preferably verified by running the global router. If not satisfactory, it may require another run of congestion aware block placement. This process may need to have a few iterations until the targeted congestion level is achieved or the a specified number of iterations are completed, the number of user iterations may be specified by the user. The placement solution of each iteration is typically stored so that user can verify them and can accept or reject any depending on its merit.

Code Architecture

FIG. 16 is a code architecture diagram 600 for an embodiment of the process to show the relationship of the various modules involved in the process. The congestion aware block placement 601 is at the center and includes the elements free space generation 603, congestion modeling 605, blockage generation 607, and overlap removal and new placement generation 609. The congestion aware block placement 601 can exchange data with the constraint manager 617, global router 615, congestion analyzer 613, and the open access data base 611. The open access data base 611 and the global router 615 can also exchange data with one another, as well as the constraint manager 617 and congestion analyzer 613.

The described embodiments of congestion aware block placement techniques are quite effective. This approach in the custom design domain gives the user an optimal placement solution to improve routability, while maintaining overall placement topology. The present methodology can also substantially reduce design turnaround time as it reduces the routing congestion at the placement stage which is much early in the design cycle. It further can improve the design reliability as congestion hot spots are removed as much as possible at the placement stage itself; maintain design constraints while removing congestion; and work with multiple levels of hierarchy and support layout as well as abstract views.

Example Embodiments

FIGS. 17-24 show screenshots of the display on a user's computer, that, along with the usual input devices (keyboard, mouse, etc.) serve as a user interface and represent how congestion is reduced in the design using embodiments of the present invention.

Figure 17:
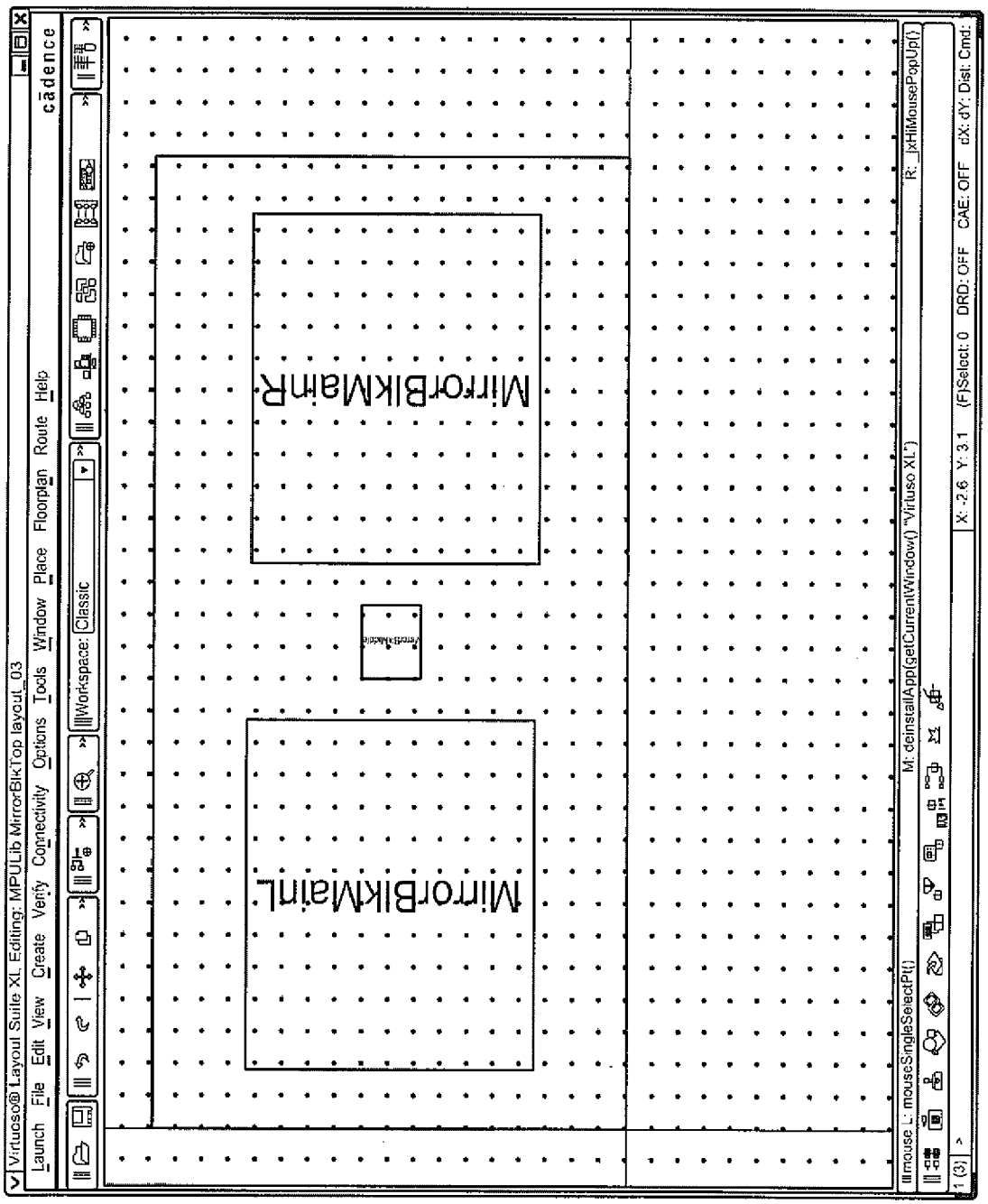
FIG. 17 shows a design after initial block placement and before running global router.
Figure 18:
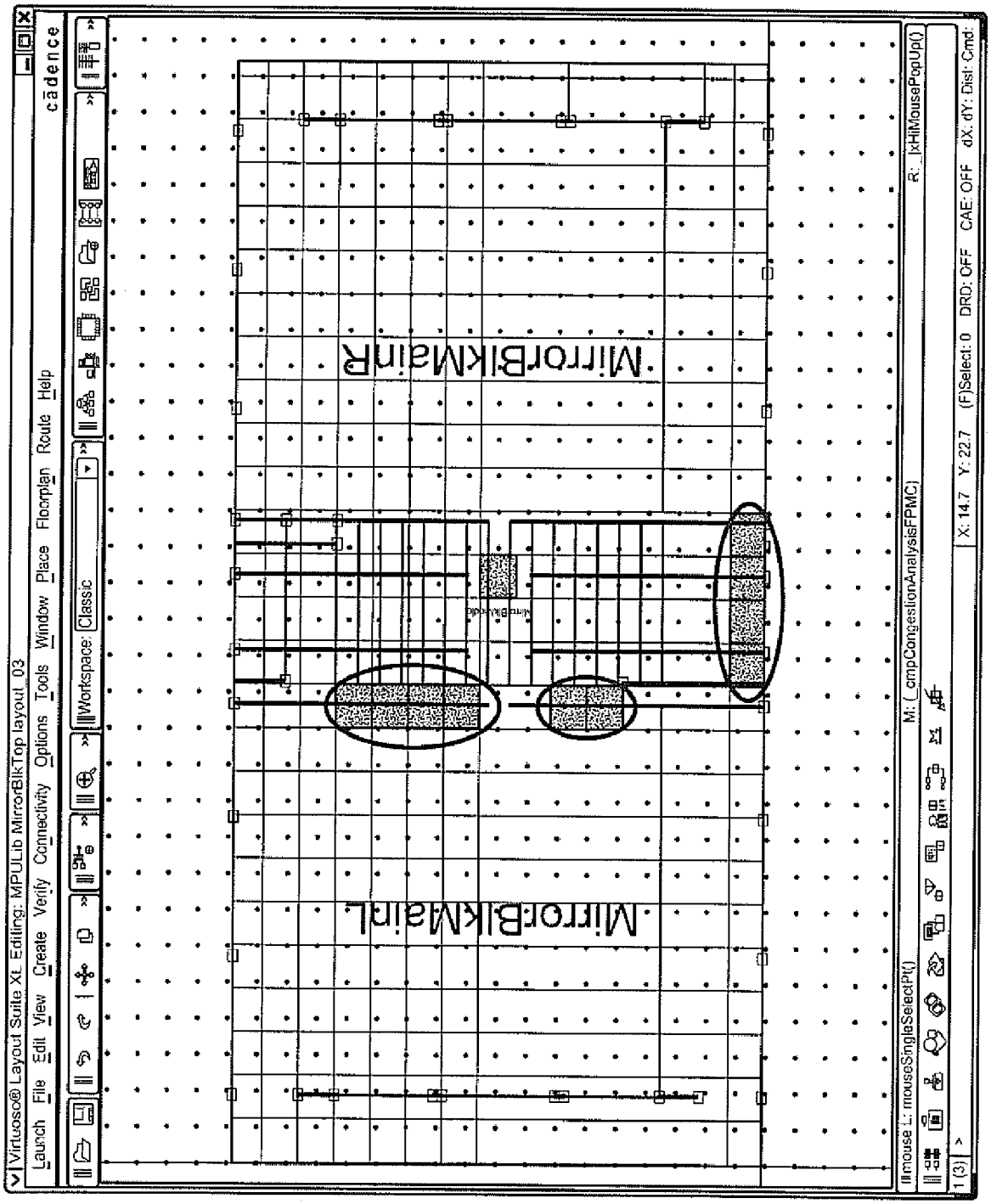
FIG. 18 illustrates a global routed design with congested GCells.
Figure 19:
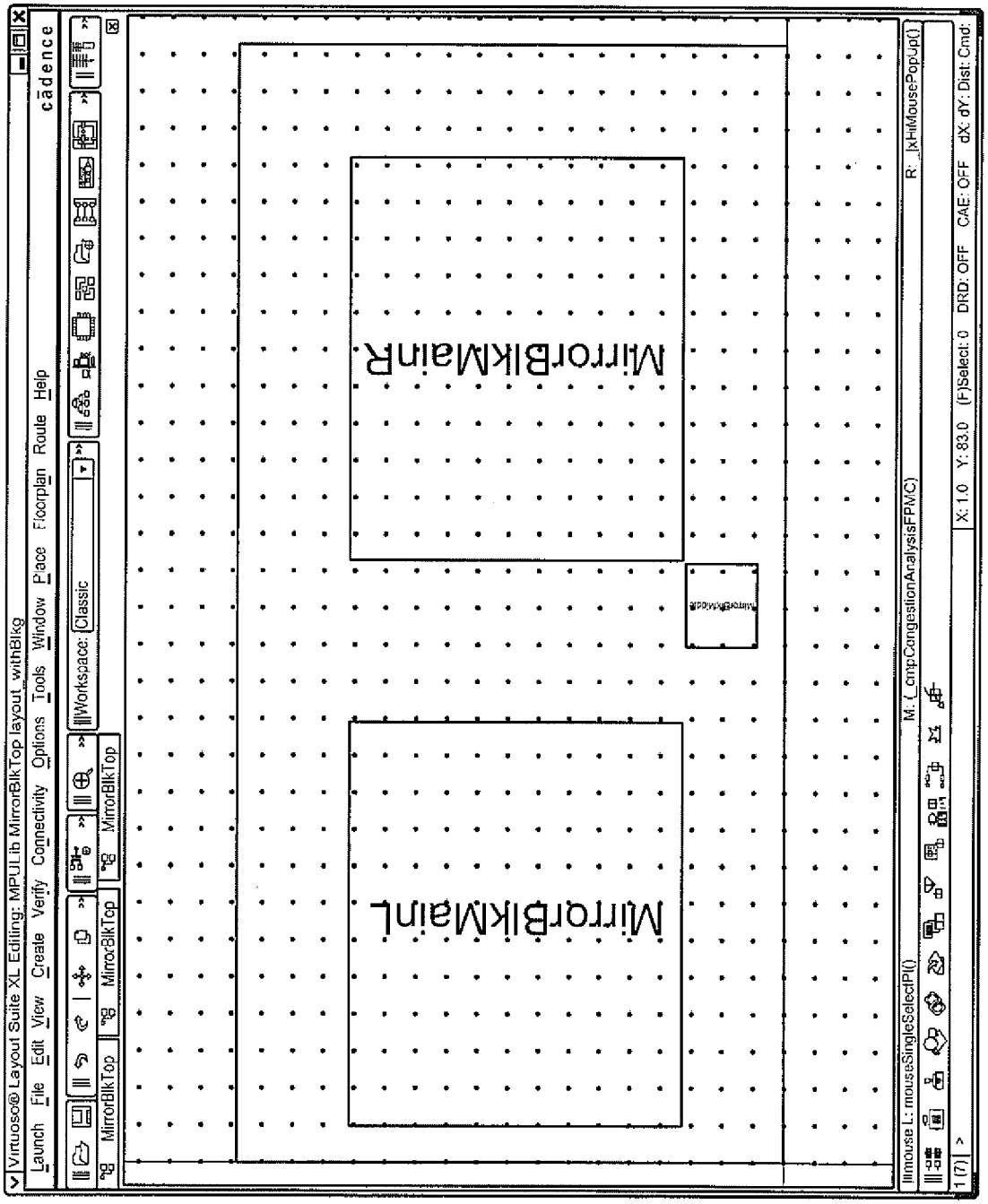
FIG. 19 shows the new block placement after running congestion aware block placer.
Figure 20:
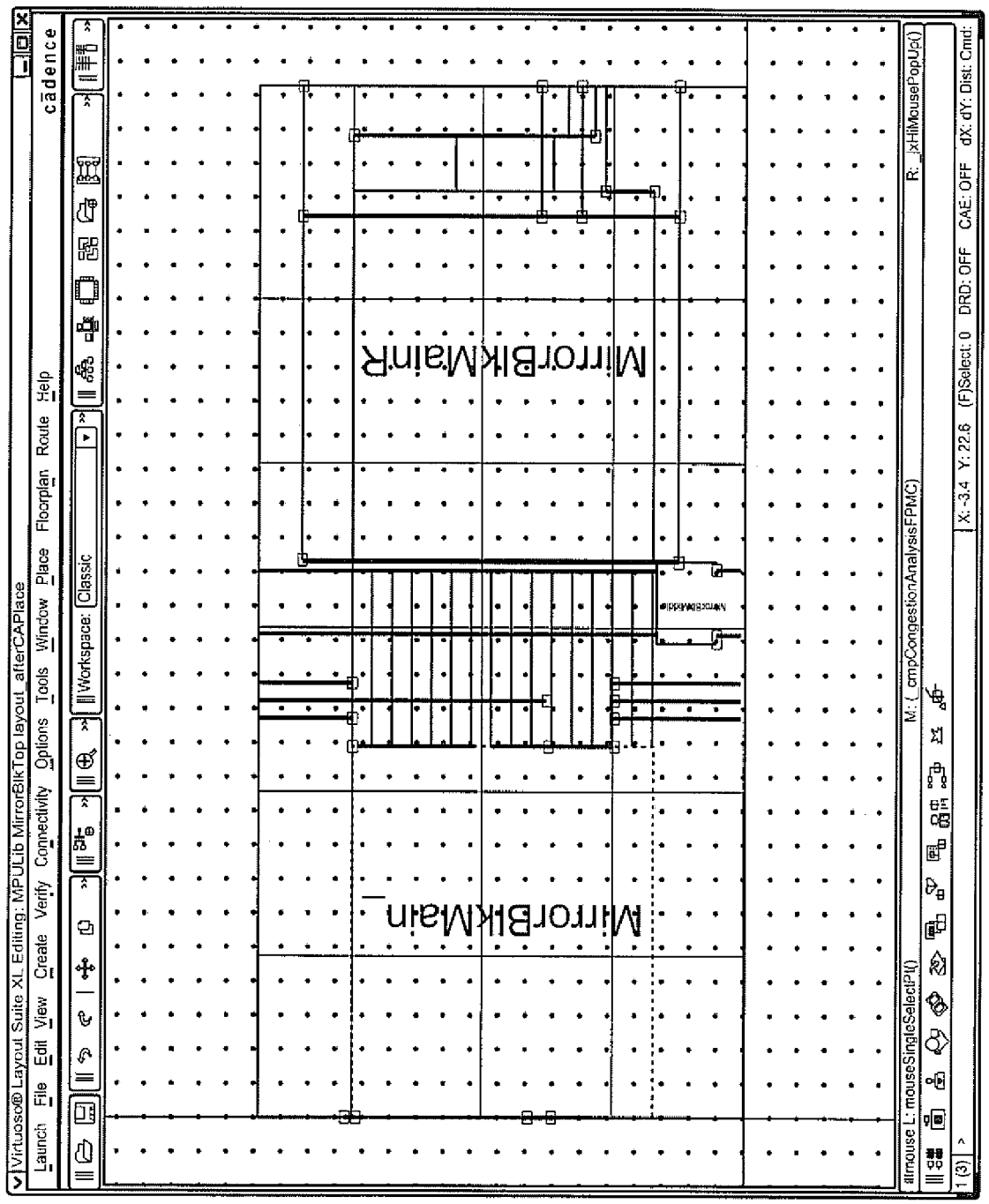
FIG. 20 shows the routing congestion is removed from design after re-running the global router.

FIG. 17 shows an exemplary design with three blocks and FIG. 18 shows the congestion after global routing on the same design. In FIG. 18, the areas within the three ovals represent high congestion areas. FIG. 19 represents the modified placement using aspects of the present invention. As shown in FIG. 20, there is no congestion after global routing with the new placement.

Figure 21:
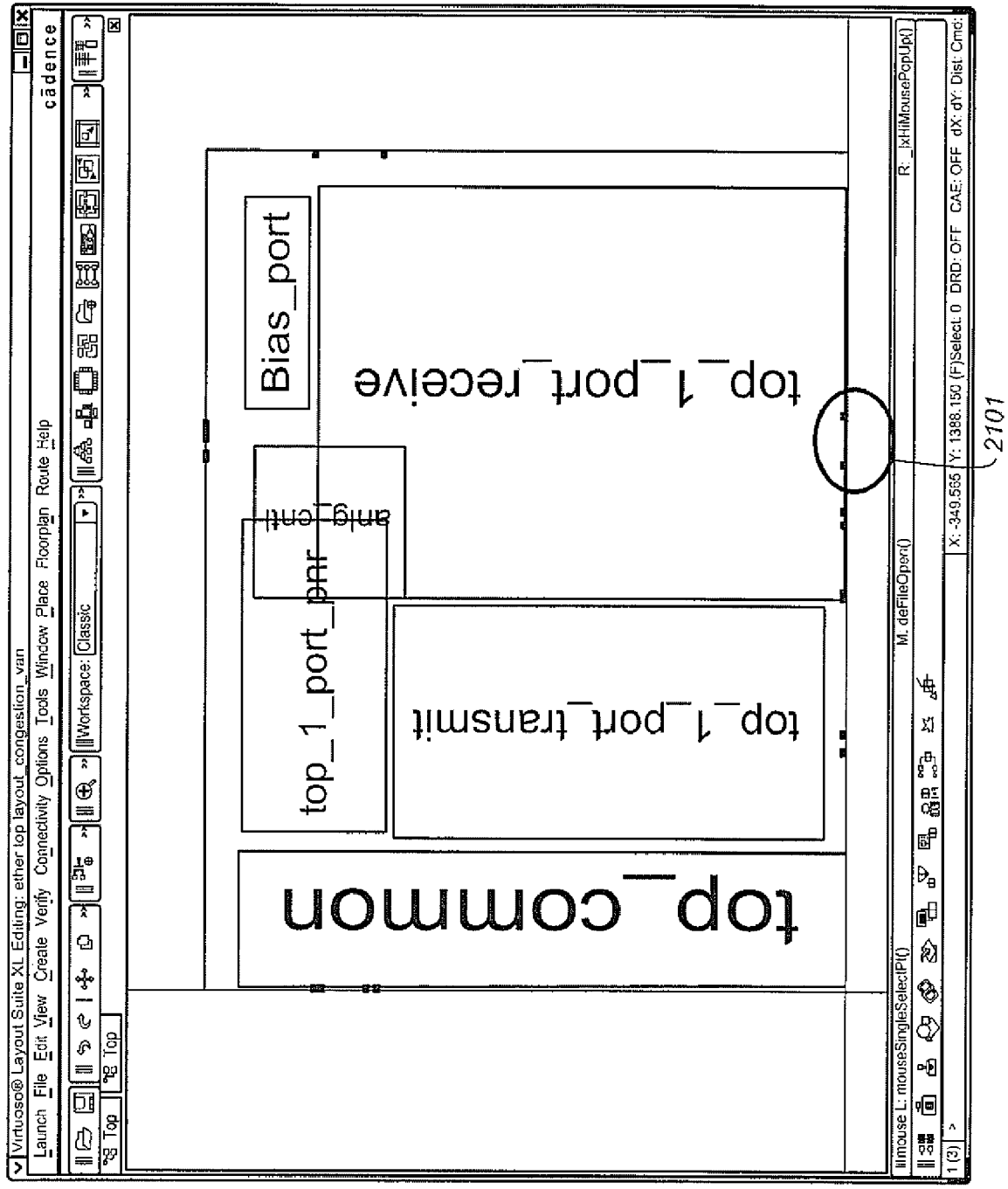
FIG. 21 shows a design after initial block placement and after global routing. The circled area in the figure is a congested area of the design.
Figure 22:
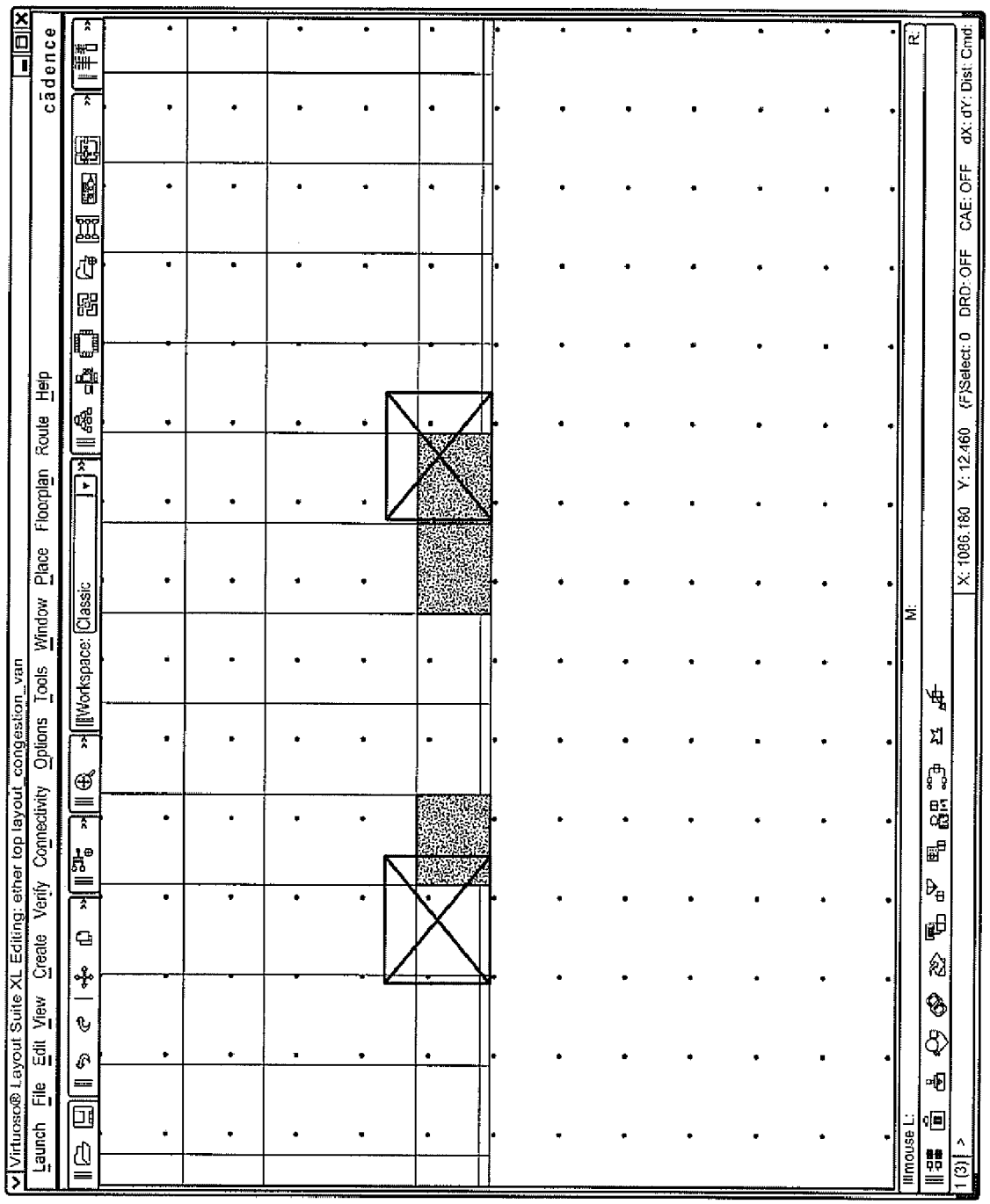
FIG. 22 shows a closer look of the circled area. It shows the congested GCells.
Figure 23:
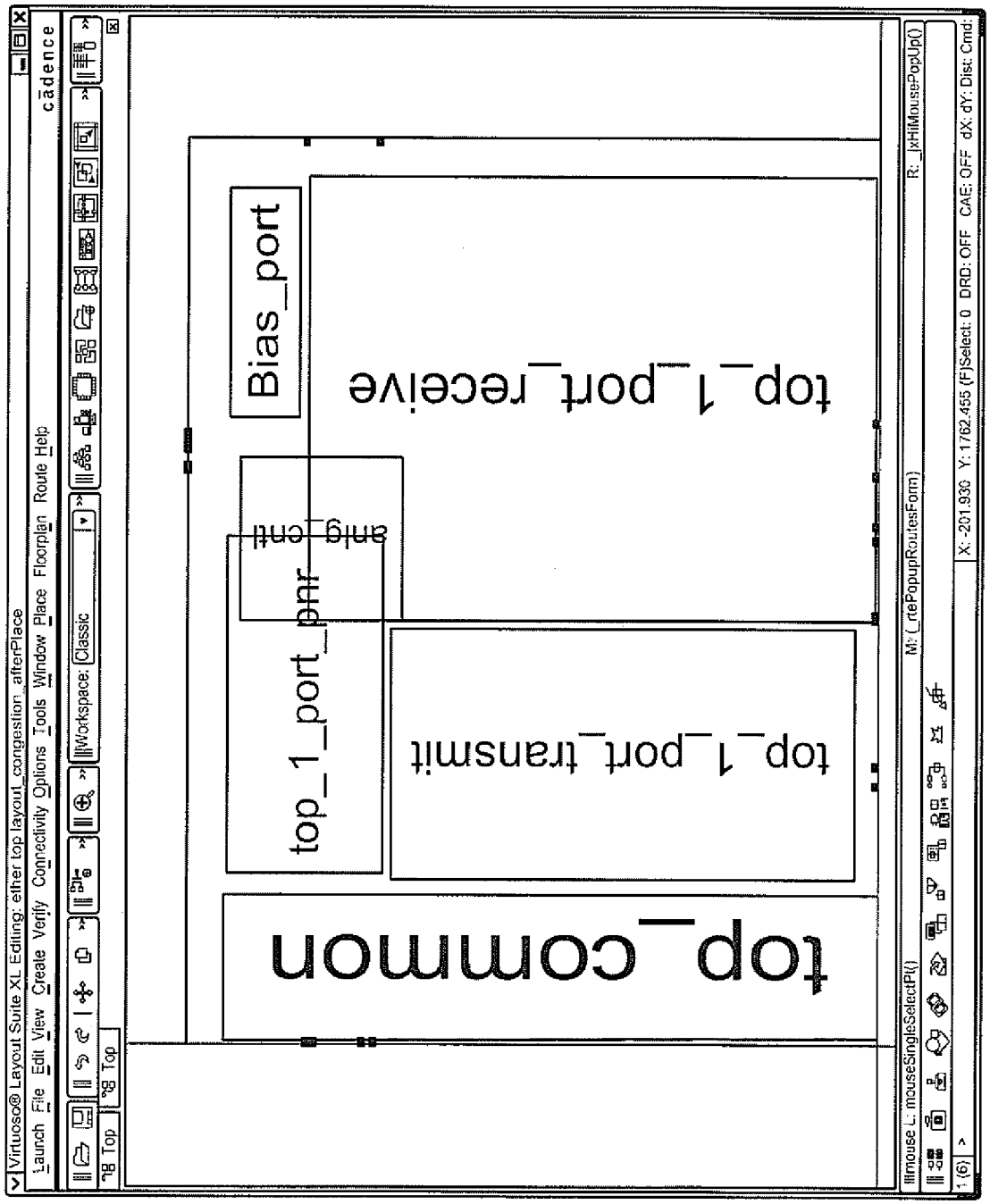
FIG. 23 shows a new block placement after running congestion aware block placer.
Figure 24:
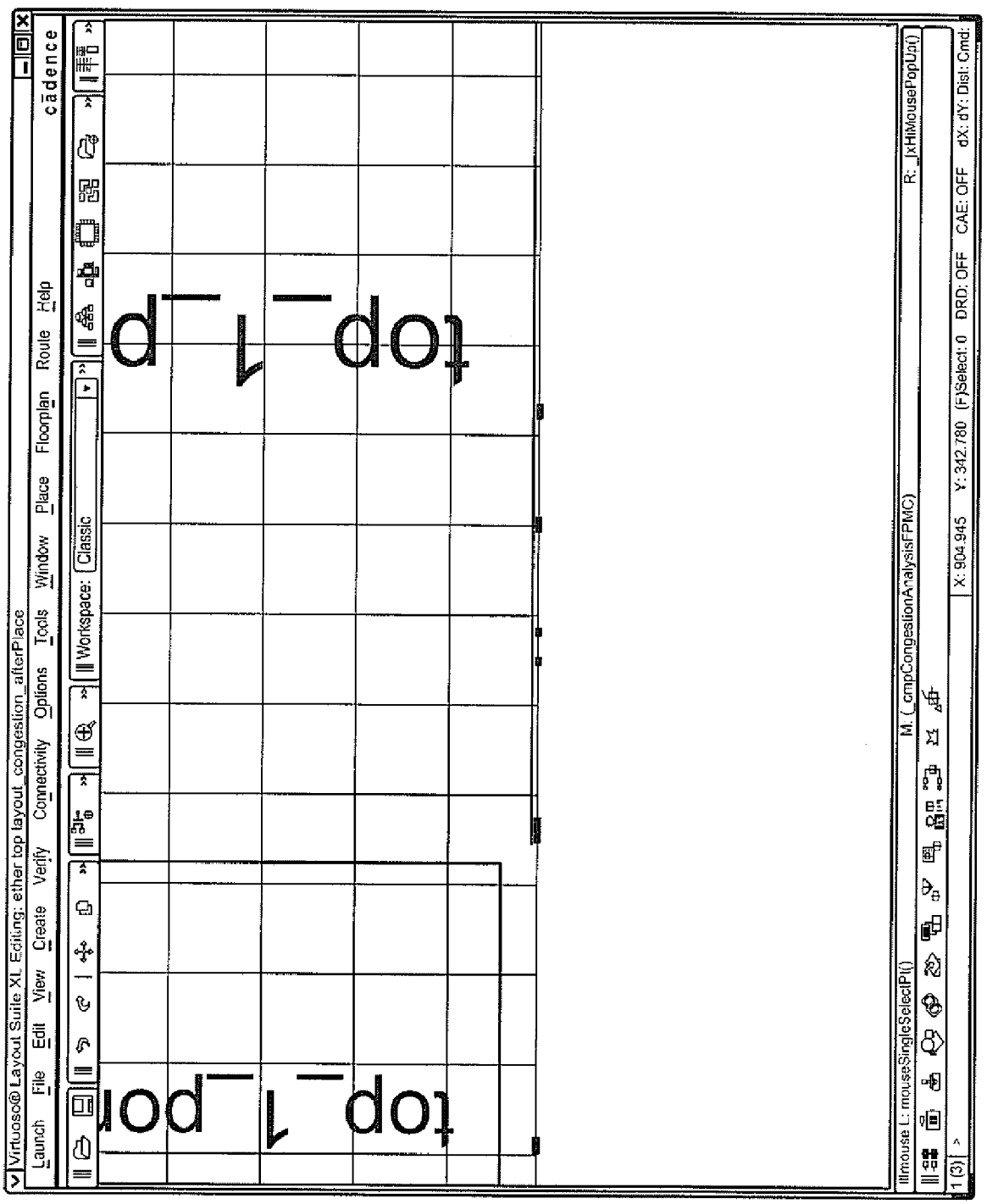
FIG. 24 shows that there is no congestion after running the global router with the new block placement.

FIG. 21 shows another design with six blocks. After the global routing (211, FIG. 2) it reports congestion at the bottom of the instance "top_1_port_receive". A closer look at high congestion region (the oval 2101 just right of center at bottom of FIG. 21) is shown in the FIG. 22. FIG. 22 shows that there are three congested GCell in that region. Congestion aware block placer generates a placement solution shown in the FIG. 23. FIG. 24 shows the congestion data after global routing with the new placement. The high congestion areas before the congestion aware block placement are now at the satisfactory congestion level. The intention of the design is to preferably show no major change in topology.

Conclusion and Generalizations

Although described above with respect to specific examples and embodiments, the techniques given here are more generally applicable. In the digital domain, design spaces are generally regular as digital placers are mainly row based. If the irregular spaces increase in design then the new space based approach can be helpful to remove congestion. The embodiments of this invention can be used in the printed circuit board (PCB) domain, where design spaces are irregular due to the use of passive components (registers, capacitors, inductors etc.) in the design. Hence this spaced based method can be leveraged to get the optimal placement. Examples outside of electronic design automation could include city planning as another area where this space based method can be useful to optimize the traffic congestion.

Many aspects of the methods of the present invention will most commonly be implemented in software as a set of instructions for a computer program product, although many of these can be implemented in hardware or by a combination of software and hardware. For instance, FIG. 17 is an example of a presentation on a display of a computer system running such a software product. Further, the different operations described may be executed in various orders, or using different specific products, other than those of the embodiments while still maintaining various aspects of the present invention. As will be understood in the art, the invention or components thereof may be embodied in a fixed media program component containing logic instructions and/or data that when loaded into an appropriately configured computing device cause that device to perform according to the embodiments of the invention. As will be understood in the art, a fixed media program may be delivered to a user on a fixed media for loading in a user's computer or a fixed media program can reside on a remote server that a user accesses through a communication medium in order to download a program component. Examples of such fixed media include a disk-type optical or magnetic media, magnetic tape, solid state memory, etc. Embodiments of the invention may be embodied in whole or in part as software recorded on this fixed media.

Although the various aspects of the present invention have been described with respect to certain embodiments, it is understood that the invention is entitled to protection within the full scope of the appended claims,

What is claimed is:

1. In a circuit design process, a method comprising acts of:
performing a block placement of integrated circuit design blocks;
performing a global routing among the integrated circuit design blocks;
using a computer to perform a block placement movement process that includes:
determining routing congestion within fragmented spaces between the multiple blocks:
determining whether routing congestion within the fragmented spaces meets a target;
in response to determining that routing congestion meets the target, performing detailed routing;
in response to determining that congestion does not meet the target,
determining a congestion weight within a first fragmented space adjacent to a first edge of at least one block relative to a congestion weight within a second fragmented space adjacent to a second opposed edge of the at least one block; and
moving a placement of the at least one block in a first direction toward one of the first and second fragmented space determined to have a lower relative congestion weight and in a direction away from an other of the first and second fragmented space determined to have the higher relative congestion weight so as to produce a revised placement;
performing another global routing among the integrated circuit design blocks having the revised placement;
determining whether routing congestion within the fragmented spaces between the multiple blocks having the revised placement meets the target;
in response to determining that routing congestion between the multiple blocks having the revised placement meets the target, performing detailed routing;
in response to determining that routing congestion between the multiple blocks having the revised placement does not meet the target, repeating the revised block placement movement process.

2. The method of claim 1, wherein the target value is provided by a user.

3. The method of claim 1, further comprising:
in response to performing a specified number of iterations of the block placement movement process, performing a detailed routing operation, wherein the specified number of iterations is provided by a user.

4. The method of claim 1, wherein the revising the block placement maintains design constraints.

5. The method of claim 4, wherein the design constraints are provided by a user.

6. The method of claim 1, wherein the design process is for a custom process.

7. A computer program product to perform block placement in a circuit design process, including a non-transitory computer readable medium storing executable instructions, the computer program product comprising instructions for performing a method including:
performing a block placement of integrated circuit design blocks;
performing global routing among the integrated circuit design blocks; and
using a computer to perform a block placement movement process that includes:
determining routing congestion within fragmented spaces between the multiple blocks:
determining whether routing congestion within the fragmented spaces meets a target;
in response to determining that routing congestion meets the target, performing detailed routing;
in response to determining that congestion does not meet the target,
determining a congestion weight within a first fragmented space adjacent to a first edge of at least one block relative to a congestion weight within a second fragmented space adjacent to a second opposed edge of the at least one block; and
moving a placement of the at least one block in a first direction toward one of the first and second fragmented space determined to have a lower relative congestion weight and in a direction away from an other of the first and second fragmented space determined to have the higher relative congestion weight so as to produce a revised placement;
performing another global routing among the integrated circuit design blocks having the revised placement;
determining whether routing congestion within the fragmented spaces between the multiple blocks having the revised placement meets the target;
in response to determining that routing congestion between the multiple blocks having the revised placement meets the target, performing detailed routing;
in response to determining that routing congestion between the multiple blocks having the revised placement does not meet the target, repeating the revised block placement movement process.

8. The computer program product claim 7, wherein the target value is provided by a user.

9. The computer program product claim 7, wherein the method further includes:
in response to performing a specified number of iterations of the block placement movement process, performing a detailed routing operation, wherein the specified number of iterations is provided by a user.

10. The computer program product claim 7, wherein the revising the block placement maintains design constraints.

11. The computer program product claim 10, wherein the design constraints are provided by a user.

12. The computer program product claim 7, wherein the design process is for a custom process.

13. A system for a design process of an integrated circuit containing multiple devices, comprising:
a user interface for viewing representations of the integrated circuit on a display; and
at least one processing unit including circuitry to a perform a block placement process in a circuit design process, the process including: performing a block placement of integrated circuit design blocks; performing global routing among the integrated circuit design blocks; and performing a block placement movement process that includes:
  determining routing congestion within fragmented spaces between the multiple blocks:
  determining whether routing congestion within the fragmented spaces meets a target;
  in response to determining that routing congestion meets the target, performing detailed routing;
  in response to determining that congestion does not meet the target,
  determining a congestion weight within a first fragmented space adjacent to a first edge of at least one block relative to a congestion weight within a second fragmented space adjacent to a second opposed edge of the at least one block; and
  moving a placement of the at least one block in a first direction toward one of the first and second fragmented space determined to have a lower relative congestion weight and in a direction away from an other of the first and second fragmented space determined to have the higher relative congestion weight so as to produce a revised placement;
  performing another global routing among the integrated circuit design blocks having the revised placement;
  determining whether routing congestion within the fragmented spaces between the multiple blocks having the revised placement meets the target;
  in response to determining that routing congestion between the multiple blocks having the revised placement meets the target, performing detailed routing;
  in response to determining that routing congestion between the multiple blocks having the revised placement does not meet the target, repeating the revised block placement movement process.

14. The system of claim 13, wherein the target value is provided by a user.

15. The system of claim 13, wherein the process further includes:
  in response to performing a specified number of iterations of the block placement movement process, performing a detailed routing operation, wherein the specified number of iterations is provided by a user.

16. The system of claim 13, wherein the revising the block placement maintains design constraints.

17. The system of claim 16, wherein the design constraints are provided by a user.

18. The system of claim 13, wherein the design process is for a custom process.

19. The method of claim 1,
  wherein the act of moving the placement of the at least one block further includes:
  creating a placement blockage in the fragmented space that is determined to have the higher relative congestion weight.

20. The method of claim 1,
  wherein the act of moving the placement of the at least one block further includes:
  creating a placement blockage in the fragmented space that is determined to have the higher relative congestion weight and in a region of the at least one block adjacent the fragmented space that is determined to have the higher relative congestion weight.

21. The method of claim 1,
  wherein the act of moving the placement of the at least one block further includes:
  creating a placement blockage in the fragmented space that is determined to have the higher relative congestion weight and in a region of the at least one block adjacent the fragmented space that is determined to have the higher relative congestion weight; and
  moving the at least one block by an amount sufficient so that the at least one block does not overlap with the placement blockage.

22. The method of claim 1,
  wherein the act of moving the placement of the at least one block further includes:
  creating a placement blockage in the fragmented space that is determined to have the higher relative congestion weight and in a region of the at least one block adjacent the fragmented space that is determined to have the higher relative congestion weight;
  moving the at least one block by an amount sufficient so that the at least one block does not overlap with the placement blockage; and
  removing the placement blockage after the at least one block has been moved by an amount sufficient so that the at least one block does not overlap with the placement blockage.

23. The method of claim 1,
  wherein performing a block placement movement process further includes:
  determining a congestion weight within a third fragmented space adjacent to a third edge of at least one block relative to a congestion weight within a fourth fragmented space adjacent to a fourth opposed edge of the at least one block; and
  moving a placement of the at least one block in a second direction toward one of the third and fourth fragmented space determined to have a lower relative congestion weight and in a direction away from an other of the third and fourth fragmented space determined to have the higher relative congestion weight so as to produce a revised placement.

24. The method of claim 23,
  wherein the first direction is perpendicular to the second direction.

25. A method to reduce routing congestion within an integrated circuit design comprising:
  determining routing congestion within fragmented spaces between the multiple blocks;
  determining whether routing congestion within the fragmented spaces meets a target;
  in response to determining that routing congestion meets the target, performing detailed routing;
  in response to determining that congestion does not meet the target,
  for each of multiple blocks in the design,
    determining a congestion weight within a first fragmented space adjacent to a first edge of at least one block relative to a congestion weight within a second fragmented space adjacent to a second opposed edge of the at least one block; and
    in response to a determination that the first and second congestion weights are different, using a computer to move a placement of the at least one block in a first direction toward one of the first and second fragmented space determined to have a lower relative congestion weight and in a direction away from an other of the first and second fragmented space determined to have the higher relative congestion weight so as to produce a revised placement;
  performing another global routing among the integrated circuit design blocks having the revised placements;

determining whether routing congestion within the fragmented spaces between the multiple blocks having the revised placement meets the target;

in response to determining that routing congestion between the multiple blocks having the revised placement meets the target, performing detailed routing;

in response to determining that routing congestion between the multiple blocks having the revised placement does not meet the target, repeating the revised block placement movement process.

26. The method of claim 25 further including:

for each of multiple blocks in the design, determining a congestion weight within a third fragmented space adjacent to a third edge of at least one block relative to a congestion weight within a fourth fragmented space adjacent to a fourth opposed edge of the at least one block; and in response to a determination that the first and second congestion weights are different, using a computer to move a placement of the at least one block in a second direction toward one of the third and fourth fragmented space determined to have a lower relative congestion weight and in a direction away from an other of the third and fourth fragmented space determined to have the higher relative congestion weight so as to produce a revised placement.

* * * * *